United States Patent
Lee

(10) Patent No.: US 9,741,412 B2
(45) Date of Patent: Aug. 22, 2017

(54) SEMICONDUCTOR APPARATUS

(71) Applicant: SK hynix Inc., Icheon-si, Gyeonggi-do (KR)

(72) Inventor: Tae Yong Lee, Icheon (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 204 days.

(21) Appl. No.: 14/848,480

(22) Filed: Sep. 9, 2015

(65) Prior Publication Data

US 2016/0307614 A1    Oct. 20, 2016

(30) Foreign Application Priority Data

Apr. 17, 2015   (KR) .................... 10-2015-0054558

(51) Int. Cl.
    *G11C 8/18*        (2006.01)
    *G11C 29/26*       (2006.01)
    *G11C 29/56*       (2006.01)

(52) U.S. Cl.
    CPC ............... *G11C 8/18* (2013.01); *G11C 29/26* (2013.01); *G11C 29/56012* (2013.01); *G11C 2029/2602* (2013.01); *G11C 2029/5602* (2013.01)

(58) Field of Classification Search
    CPC ..... G11C 8/18; G11C 29/26; G11C 29/56012; G11C 2029/5602
    USPC .......................................................... 710/38
    See application file for complete search history.

(56) References Cited

U.S. PATENT DOCUMENTS

| | | | | |
|---|---|---|---|---|
| 4,901,286 | A * | 2/1990 | Theus .................... | G11C 19/00 365/230.01 |
| 5,502,723 | A * | 3/1996 | Sanders ................ | H04J 3/1629 370/352 |
| 5,905,690 | A * | 5/1999 | Sakurai ............ | G01R 31/31701 365/201 |
| 8,953,394 | B2 * | 2/2015 | Jeon ....................... | G11C 5/025 365/189.05 |
| 8,966,331 | B2 * | 2/2015 | Yang ..................... | G11C 29/10 714/718 |

(Continued)

FOREIGN PATENT DOCUMENTS

KR    1020120067724 A    6/2012

*Primary Examiner* — Christopher Shin
(74) *Attorney, Agent, or Firm* — William Park & Associates Ltd.

(57) ABSTRACT

A semiconductor apparatus may include: a data storage group including first to eight data storage areas; a first channel select pad configured to transmit a first channel select signal to the first and third data storage areas; a second channel select pad configured to transmit a second channel select signal to the second and fourth data storage areas; a third channel select pad configured to transmit the first channel select signal to the sixth and eighth data storage areas; a fourth channel select pad configured to transmit the second channel select signal to the fifth and seventh data storage areas; a first clock enable pad configured to transmit a first clock enable signal to the first and third data storage areas; a second clock enable pad configured to transmit a second clock enable signal to the second and fourth data storage areas; a third clock enable pad configured to transmit the first clock enable signal to the fifth and seventh data storage areas; and a fourth clock enable pad configured to transmit the second clock enable signal to the sixth and eighth data storage areas.

8 Claims, 4 Drawing Sheets

(56) References Cited

U.S. PATENT DOCUMENTS

| | | | | |
|---|---|---|---|---|
| 9,476,938 B2* | 10/2016 | Pyeon | .............. | G01R 31/31713 |
| 2002/0133765 A1* | 9/2002 | Antosh | ................. | G11C 29/48 |
| | | | | 714/718 |
| 2003/0120891 A1* | 6/2003 | Rieger | ................ | G11C 7/1045 |
| | | | | 711/202 |
| 2010/0293325 A1* | 11/2010 | Maheshwari | ....... | G06F 13/4243 |
| | | | | 711/105 |
| 2011/0093235 A1* | 4/2011 | Oh | ..................... | G01R 31/2884 |
| | | | | 702/120 |
| 2013/0283128 A1* | 10/2013 | Lee | .................... | G06F 11/1068 |
| | | | | 714/773 |
| 2015/0340069 A1* | 11/2015 | Arai | .................... | G11C 29/021 |
| | | | | 326/30 |

* cited by examiner

SEMICONDUCTOR APPARATUS

CROSS-REFERENCES TO RELATED APPLICATION

The present application claims priority under 35 U.S.C. §119(a) to Korean application number 10-2015-0054558, filed on Apr. 17, 2015, in the Korean Intellectual Property Office, which is incorporated herein by reference in its entirety.

BACKGROUND

1. Technical Field

Various embodiments relate to a semiconductor integrated circuit, and more particularly, to a semiconductor apparatus.

2. Related Art

In general, semiconductor apparatuses are mass-produced after a large number of tests.

A semiconductor apparatus is tested in a wafer state and a package state. When the semiconductor apparatus in the wafer state is tested, a probing pad included in the semiconductor apparatus is coupled to a test device.

The test device includes a limited number of lines for coupling the semiconductor apparatus. Thus, when the number of lines coupled to one semiconductor apparatus is reduced, a larger number of semiconductor apparatuses can be tested at a time.

SUMMARY

In an embodiment of the present disclosure, a semiconductor apparatus may include: a data storage group including first to eight data storage areas; a first channel select pad configured to transmit a first channel select signal to the first and third data storage areas; a second channel select pad configured to transmit a second channel select signal to the second and fourth data storage areas; a third channel select pad configured to transmit the first channel select signal to the sixth and eighth data storage areas; a fourth channel select pad configured to transmit the second channel select signal to the fifth and seventh data storage areas; a first clock enable pad configured to transmit a first clock enable signal to the first and third data storage areas; a second clock enable pad configured to transmit a second clock enable signal to the second and fourth data storage areas; a third clock enable pad configured to transmit the first clock enable signal to the fifth and seventh data storage areas; and a fourth clock enable pad configured to transmit the second clock enable signal to the sixth and eighth data storage areas.

In an embodiment of the present disclosure, a semiconductor apparatus may include: a data storage group including a first data storage area activated when both of a first channel select signal and a first clock enable signal are enabled, a second data storage area activated when both of a second channel select signal and a second clock enable signal are enabled, a third data storage area activated when both of the first channel select signal and the second clock enable signal are enabled, and a fourth data storage area activated when both of the second channel select signal and the first clock enable signal are enabled; first and second channel select pads configured to transmit the first channel select signal to the first and third data storage areas, respectively; third and fourth channel select pads configured to transmit the second channel select signal to the second and fourth data storage areas, respectively; first and second clock enable pads configured to transmit the first clock enable signal to the first and fourth data storage areas, respectively; and third and fourth clock enable pads configured to transmit the second clock enable signal to the second and third data storage areas, respectively.

In an embodiment of the present disclosure, a semiconductor apparatus may include: a data storage group including first to eighth data storage areas; a first channel select pad configured to transmit a channel select signal to the first and third data storage areas; a first inverting unit configured to invert the channel select signal inputted from the first channel select pad and transmit the inverted channel select signal to the second and fourth data storage areas; a first clock enable pad configured to transmit a clock enable signal to the first and third data storage areas; a second inverting unit configured to invert the clock enable signal inputted from the first clock enable pad and transmit the inverted clock enable signal to the second and fourth data storage areas; a second channel select pad configured to transmit the channel select signal to the sixth and eighth data storage areas; a third inverting unit configured to invert the channel select signal inputted from the second channel select pad and transmit the inverted channel select signal to the fifth and seventh data storage areas; a second clock enable pad configured to transmit the clock enable signal to the fifth and seventh data storage areas; and a fourth inverting unit configured to invert the clock enable signal inputted from the second clock enable pad and transmit the inverted clock enable signal to the sixth and eighth data storage areas.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present disclosure will be described below with reference to the accompanying drawings through exemplary embodiments.

Figure 1:
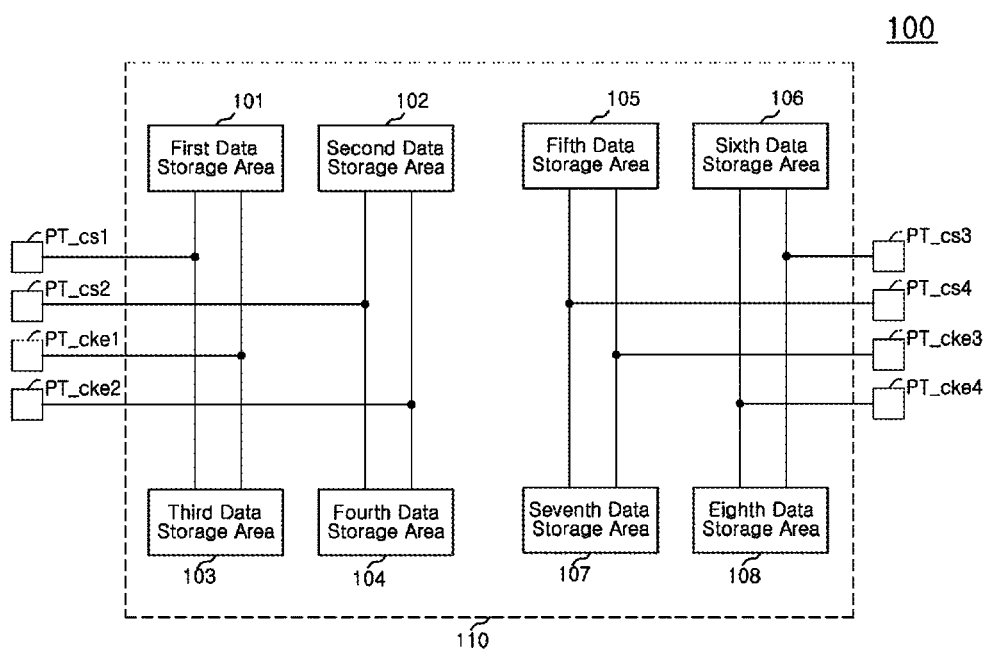
FIG. 1 is a configuration diagram of a semiconductor apparatus according to an embodiment of the present disclosure.

As illustrated in FIG. 1, a semiconductor apparatus 100 according to an embodiment of the present disclosure may include a data storage group 110, first to fourth channel select pads PT_cs1 to PT_cs4, and first to fourth clock enable pads PT_cke1 to PT_cke4.

The data storage group 110 may include first to eighth data storage areas 101 to 108.

The first channel select pad PT_cs1 may be coupled to the first data storage area 101 and the third data storage area 103.

The second channel select pad PT_cs2 may be coupled to the second data storage area 102 and the fourth data storage area 104.

The third channel select pad PT_cs3 may be coupled to the sixth data storage area 106 and the eighth data storage area 108.

The fourth channel select pad PT_cs4 may be coupled to the fifth data storage area 105 and the seventh data storage area 107.

The first clock enable pad PT_cke1 may be coupled to the first data storage area 101 and the third data storage area 103.

The second clock enable pad PT_cke2 may be coupled to the second data storage area 102 and the fourth data storage area 104.

The third clock enable pad PT_cke3 may be coupled to the fifth data storage area 105 and the seventh data storage area 107.

The fourth clock enable pad PT_cke4 may be coupled to the sixth data storage area 106 and the eighth data storage area 108.

Figure 3:
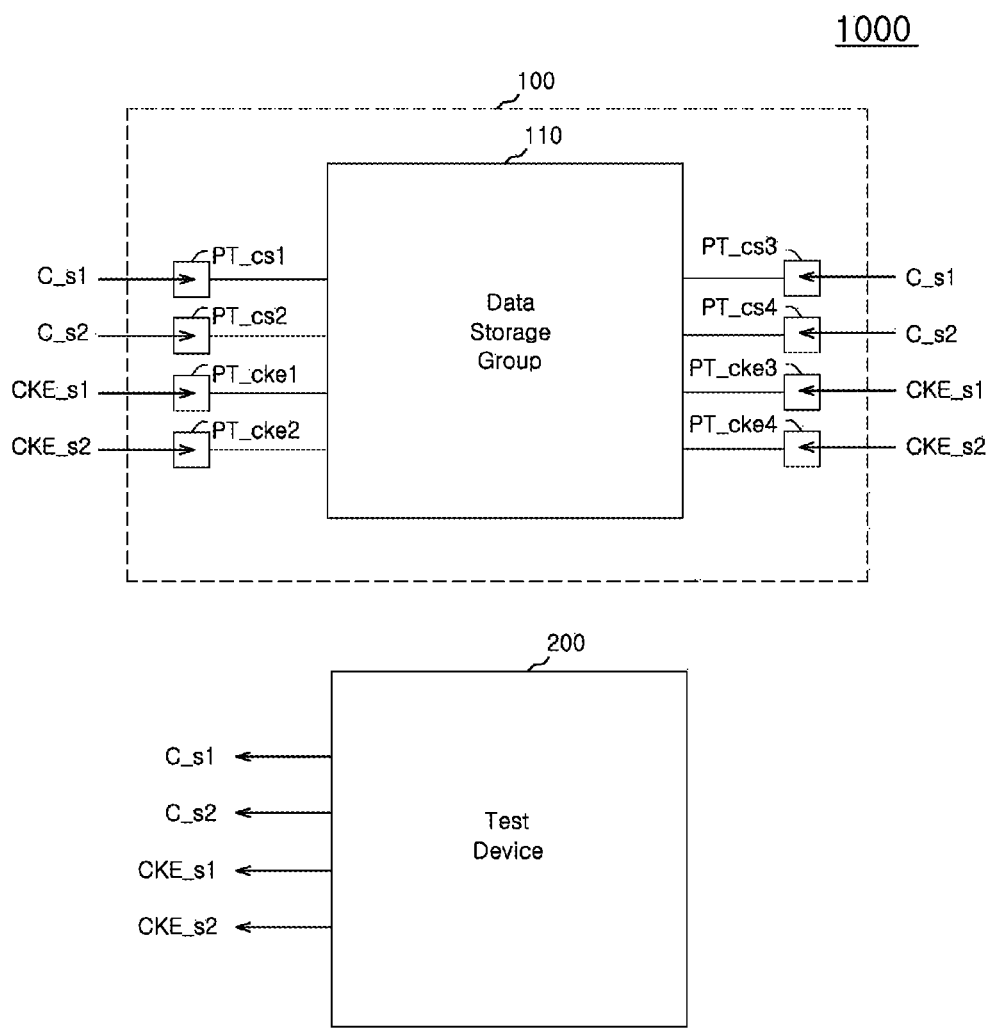
FIGS. 3 and 4 are configuration diagrams illustrating connection between a test device and the semiconductor apparatus according to the embodiment of the present disclosure.
Figure 4:
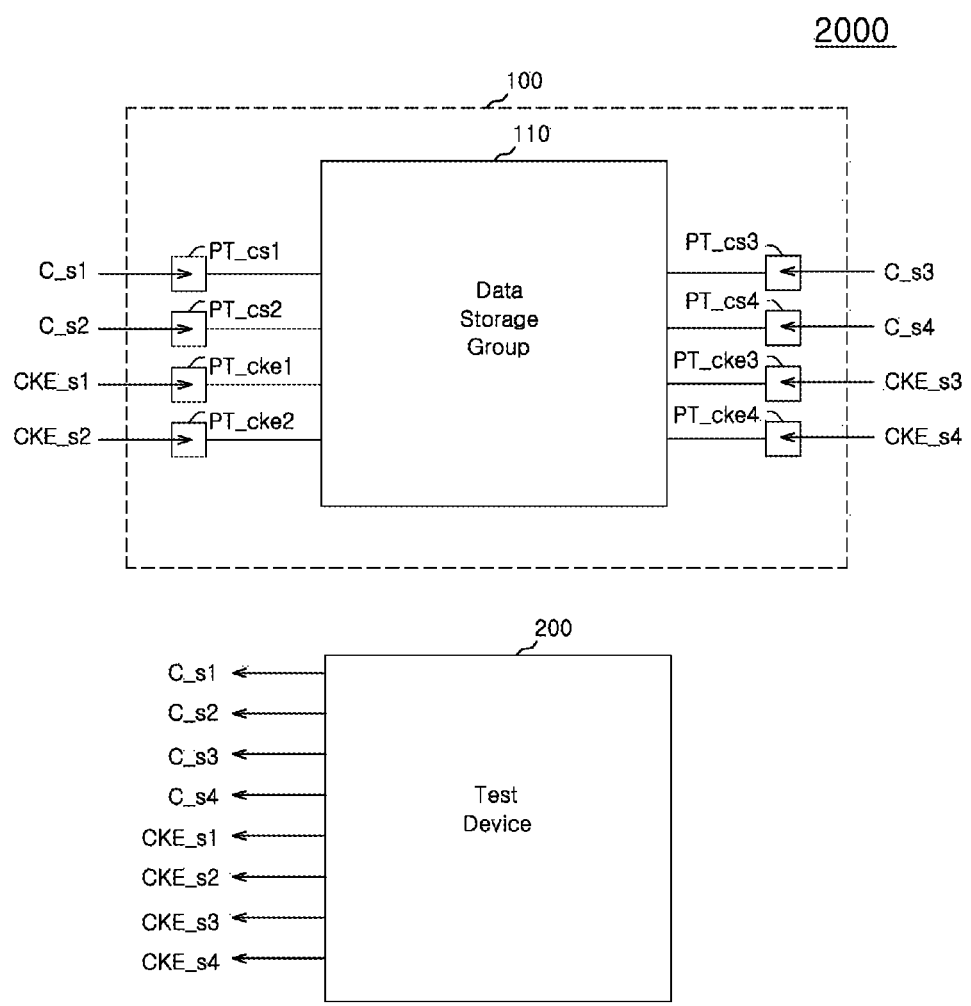

At this time, the first and third channel select pads PT_cs1 and PT_cs3 may receive the same channel select signal C_s1 (refer to FIG. 3), or receive different channel select signals C_s1 and C_s3 (refer to FIG. 4). The second and fourth channel select pads PT_cs2 and PT_cs4 may receive the same channel select signal C_s2 (refer to FIG. 3), or receive different channel select signals C_s2 and C_s4 (refer to FIG. 4). The first and third clock enable pads PT_cke1 and PT_cke3 may receive the same clock enable signal CKE_s1 (refer to FIG. 3), or receive different clock enable signals CKE_s1 and CKE_s3 (refer to FIG. 4). The second and fourth clock enable pads PT_cke2 and PT_cke4 may receive the same clock enable signal CKE_s2 (refer to FIG. 3), or receive different clock enable signals CKE_s2 and CKE_s4 (refer to FIG. 4).

Each of the first to fourth channel select pads PT_cs1 to PT_cs4 and the first to fourth clock enable pads PT_cke1 to PT_cke4 may transmit a signal inputted thereto to the data storage area coupled thereto.

Each of the first to eighth data storage areas 101 to 108 may be activated when both of the channel select signal and the clock enable signal inputted thereto are enabled.

The operation of the semiconductor apparatus having the above-described configuration according to the embodiment of the present disclosure will be described with reference to FIGS. 1, 3, and 4.

As illustrated in FIG. 3, the first and third channel select pads PT_cs1 and PT_cs3 of the semiconductor apparatus 100 according to the embodiment of the present disclosure may receive the same signal, that is, the first channel signal C_s1 in common, and the second and fourth channel select pads PT_cs2 and PT_cs4 may receive the same signal, that is, the second channel select signal C_s2 in common. Furthermore, the first and third clock enable pads PT_che1 and PT_cke3 may receive the same signal, that is, the first clock enable signal CKE_s1, and the second and fourth clock enable pads PT_che2 and PT_che4 may receive the same signal, that is, the second clock enable signal CKE_s2. At this time, the first and second channel select signals C_s1 and C_s2 and the first and second clock enable signals CKE_s1 and CKE_s2 may be outputted from a test device 200 outside the semiconductor apparatus 100.

The first to fourth channel select pads PT_cs1 to PT_cs4 and the first to fourth clock enable pads PT_cke1 to PT_cke4 may transmit signals C_s1, C_s2, CKE_s1, and CKE_s2 received from the test device 200 to the data storage group 110.

As illustrated in FIG. 1, the data storage group 110 may include first to eighth data storage areas 101 to 108.

The first channel select signal C_s1 inputted from the first channel select pad PT_cs1 may be inputted to the first data storage area 101 and the third data storage area 103.

The first channel select signal C_s1 inputted from the third channel select pad PT_cs3 may be inputted to the sixth data storage area 106 and the eighth data storage area 108.

The second channel select signal C_s2 inputted from the second channel select pad PT_cs2 may be inputted to the second data storage area 102 and the fourth data storage area 104.

The second channel select signal C_s2 inputted from the fourth channel select pad PT_cs4 may be inputted to the fifth data storage area 105 and the seventh data storage area 107.

The first clock enable signal CKE_s1 inputted from the first clock enable pad PT_cke1 may be inputted to the first data storage area 101 and the third data storage area 103.

The first clock enable signal CKE_s1 inputted from the third clock enable pad PT_cke3 may be inputted to the fifth data storage area 105 and the seventh data storage area 107.

The second clock enable signal CKE_s2 inputted from the second clock enable pad PT_cke2 may be inputted to the second data storage area 102 and the fourth data storage area 104.

The second clock enable signal CKE_s2 inputted from the fourth clock enable pad PT_cke4 may be inputted to the sixth data storage area 106 and the eighth data storage area 108.

At this time, only one of the first and second channel select signals C_s1 and C_s2 may be enabled, and the other one may be disabled. Furthermore, only one of the first and second clock enable signals CKE_s1 and CKE_s2 may be enabled, and the other one may be disabled.

Each of the first to eighth data storage areas 101 to 108 may be activated when both of the channel select signal and the clock enable signal inputted thereto are enabled.

For example, when both of the first channel select signal C_s1 and the first clock enable signal CKE_s1 are enabled, the first and third data storage areas 101 and 103 may be activated. When both of the first channel select signal C_s1 and the second clock enable signal CKE_s2 are enabled, the sixth and eighth data storage areas 106 and 108 may be activated. When both of the second channel select signal C_s2 and the first clock enable signal CKE_s1 are enabled, the fifth and seventh data storage areas 105 and 107 may be activated. When both of the second channel select signal C_s2 and the second clock enable signal CKE_s2 are enabled, the second and fourth data storage areas 102 and 104 may be activated.

The semiconductor apparatus according to the embodiment of the present disclosure may input the same signal to a pair of pads among the plurality of pads, in order to selectively activate a plurality of data storage areas.

As illustrated in FIG. 4, the semiconductor apparatus 100 according to the embodiment of the present disclosure may input the first to fourth channel select signals C_s1 to C_s4 to the first to fourth channel select pads PT_cs1 to PT_cs4, respectively. Furthermore, the semiconductor apparatus 100 may input the first to fourth clock enable signals CKE_s1 to CKE_s4 to the first to fourth clock enable pads PT_cke1 to PT_cke4, respectively. At this time, the first to fourth channel select signals C_s1 to C_s4 and the first to fourth clock enable signals CKE_s1 to CKE_s4 may be outputted from the test device 200 outside the semiconductor apparatus 100.

The first to fourth channel select pads PT_cs1 to PT_cs4 and the first to fourth clock enable pads PT_cke1 to PT_cke4 may transmit signals C_s1, C_s2, CKE_s1, and CKE_s2 received from the test device 200 to the data storage group 110.

As illustrated in FIG. 1, the data storage group 110 may include the first to eighth data storage areas 101 to 108.

The first channel select signal C_s1 inputted from the first channel select pad PT_cs1 may be inputted to the first data storage area 101 and the third data storage area 103.

The second channel select signal C_s2 inputted from the second channel select pad PT_cs2 may be inputted to the second data storage area 102 and the fourth data storage area 104.

The third channel select signal C_s3 inputted from the third channel select pad PT_cs3 may be inputted to the sixth data storage area 106 and the eighth data storage area 108.

The fourth channel select signal C_s4 inputted from the fourth channel select pad PT_cs4 may be inputted to the fifth data storage area 105 and the seventh data storage area 107.

The first clock enable signal CKE_s1 inputted from the first clock enable pad PT_cke1 may be inputted to the first data storage area 101 and the third data storage area 103.

The second clock enable signal CKE_s2 inputted from the second clock enable pad PT_cke2 may be inputted to the second data storage area 102 and the fourth data storage area 104.

The third clock enable signal CKE_s3 inputted from the third clock enable pad PT_cke3 may be inputted to the fifth data storage area 105 and the seventh data storage area 107.

The fourth clock enable signal CKE_s4 inputted from the fourth clock enable pad PT_cke4 may be inputted to the sixth data storage area 106 and the eighth data storage area 108.

At this time, only one of the first to fourth channel select signals C_s1 to C_s4 may be enabled, and the others may be disabled. Furthermore, only one of the first to fourth clock enable signals CKE_s1 to CKE_s4 may be enabled, and the others may be disabled.

Each of the first to eighth data storage areas 101 to 108 may be activated when both of the channel select signal and the clock enable signal inputted thereto are enabled.

For example, when both of the first channel select signal C_s1 and the first clock enable signal CKE_s1 are enabled, the first and third data storage areas 101 and 103 may be activated. When both of the second channel select signal C_s2 and the second clock enable signal CKE_s2 are enabled, the second and fourth data storage areas 102 and 104 may be activated. When both of the third channel select signal C_s3 and the fourth clock enable signal CKE_s4 are enabled, the sixth and eighth data storage areas 106 and 108 may be activated. When both of the fourth channel select signal C_s4 and the third clock enable signal CKE_s3 are enabled, the fifth and seventh data storage areas 105 and 107 may be activated.

As such, the semiconductor apparatus 100 according to the embodiment of the present disclosure may selectively activate the data storage areas even though different signals are inputted to the respective pads from the test device 200, and selectively activate the data storage areas even though the same signal is inputted to a pair of pads in common.

Figure 2:
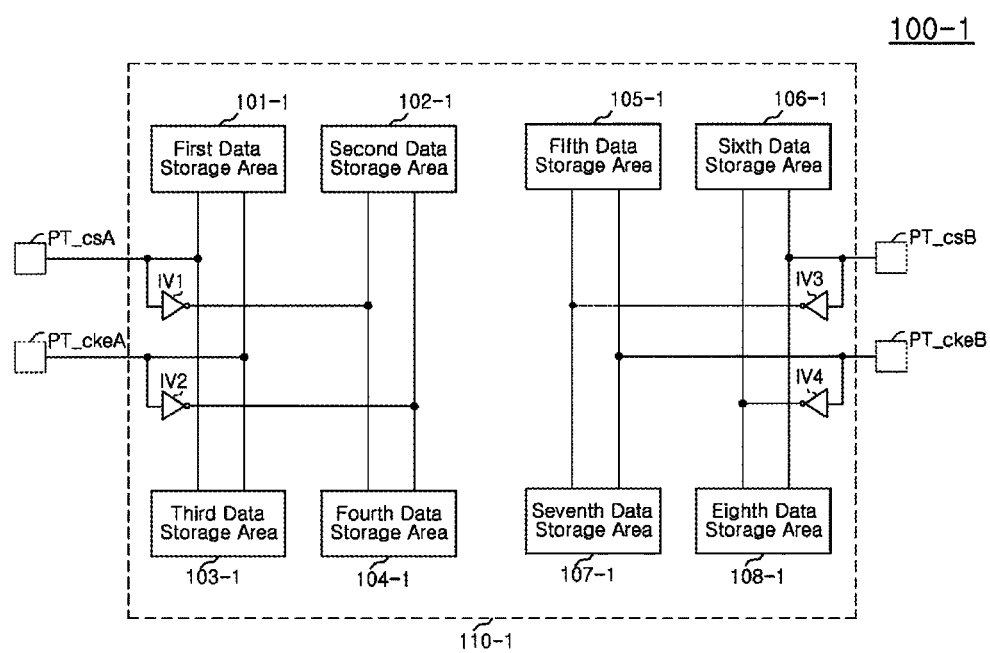
FIG. 2 is a configuration diagram of a semiconductor apparatus according to an embodiment of the present disclosure.

As illustrated in FIG. 2, a semiconductor apparatus 100-1 according to an embodiment of the present disclosure may include first and second channel select pads PT_csA and PT_csB, first and second clock enable pads PT_ckeA and PT_ckeB, and a data storage group 110-1.

The data storage group 110-1 may include first to eighth data storage areas 101-1 to 108-1 and first to fourth inverting units IV1 to IV4.

The first channel select pad PT_csA may be coupled to the first data storage area 101-1 and the third data storage area 103-1.

The first inverting unit IV1 may be coupled to the first channel select pad PT_csA, the second data storage area 102-1, and the fourth data storage area 104-1. At this time, the first inverting unit IV1 may include an inverter which inverts the signal inputted from the first channel select pad PT_csA and transmits the inverted signal to the second and fourth data storage areas 102-1 and 104-1.

The second channel select pad PT_csB may be coupled to the sixth data storage area 106-1 and the eighth data storage area 108-1.

The third inverting unit IV3 may be coupled to the second channel select pad PT_csB, the fifth data storage area 105-1, and the seventh data storage area 107-1. At this time, the third inverting unit IV3 may include an inverter which inverts the signal inputted from the second channel select pad PT_csB and transmits the inverted signal to the fifth and seventh data storage areas 105-1 and 107-1.

The first clock enable pad PT_ckeA may be coupled to the first data storage area 101-1 and the third data storage area 103-1.

The second inverting unit IV2 may be coupled to the first clock enable pad PT_ckeA, the second data storage area 102-1, and the fourth data storage area 104-1. At this time, the second inverting unit IV2 may invert a signal inputted from the first clock enable pad PT_ckeA and transmit the inverted signal to the second and fourth data storage areas 102-1 and 104-1.

The second clock enable pad PT_ckeB may be coupled to the fifth data storage area 105-1 and the seventh data storage area 107-1.

The fourth inverting unit IV4 may be coupled to the second clock enable pad PT_ckeB, the sixth data storage area 106-1, and the eighth data storage area 108-1. At this time, the fourth inverting unit IV4 may include an inverter which inverts the signal inputted from the second channel select pad PT_csB and transmits the inverted signal to the sixth and eighth data storage areas 106-1 and 108-1.

At this time, the first and second channel select pads PT_csA and PT_csB may receive a channel select signal (not illustrated) in common. The first and second clock enable pads PT_ckeA and PT_ckeB may receive a clock enable signal (not illustrated) in common.

Each of the first to eighth data storage areas 101 to 108 may be activated when both of two signals inputted thereto are at a high level.

The operation of the semiconductor apparatus having the above-described configuration according to the embodiment of the present disclosure will be described as follows.

When signals (for example, channel select signals) inputted from the first and second channel select pads PT_csA and PT_csB are at a high level and signals (for example, clock enable signals) inputted from the first and second clock enable pads PT_ckeA and PT_ckeB are at a high level, the first and third data storage areas 101-1 and 103-1 may be activated.

When the signals (for example, channel select signals) inputted from the first and second channel select pads PT_csA and PT_csB are at a high level and the signals (for example, clock enable signals) inputted from the first and second clock enable pads PT_ckeA and PT_ckeB are at a low level, the first sixth and eighth data storage areas 106-1 and 108-1 may be activated.

When the signals (for example, channel select signals) inputted from the first and second channel select pads PT_csA and PT_csB are at a low level and the signals (for example, clock enable signals) inputted from the first and second clock enable pads PT_ckeA and PT_ckeB are at a high level, the fifth and seventh data storage areas 105-1 and 107-1 may be activated.

When the signals (for example, channel select signals) inputted from the first and second channel select pads PT_csA and PT_csB are at a low level and the signals (for example, clock enable signals) inputted from the first and second clock enable pads PT_ckeA and PT_ckeB are at a low level, the second and fourth data storage areas 102-1 and 104-1 may be activated.

The semiconductor apparatus 100-1 according to the embodiment of the present disclosure can selectively activate the data storage areas like the semiconductor apparatus 100, even though the number of pads is reduced to the half of the number of pads included in the semiconductor apparatus 100 illustrated in FIG.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
a data storage group comprising first to eight data storage areas;
a first channel select pad configured to transmit a first channel select signal to the first and third data storage areas;
a second channel select pad configured to transmit a second channel select signal to the second and fourth data storage areas;
a third channel select pad configured to transmit the first channel select signal to the sixth and eighth data storage areas;
a fourth channel select pad configured to transmit the second channel select signal to the fifth and seventh data storage areas;
a first clock enable pad configured to transmit a first clock enable signal to the first and third data storage areas;
a second clock enable pad configured to transmit a second clock enable signal to the second and fourth data storage areas;
a third clock enable pad configured to transmit the first clock enable signal to the fifth and seventh data storage areas; and
a fourth clock enable pad configured to transmit the second clock enable signal to the sixth and eighth data storage areas.

2. The semiconductor apparatus according to claim 1, wherein only one of the first and second channel select signals is enabled, and the other is disabled, and
only one of the first and second clock enable signals is enabled, and the other is disabled.

3. The semiconductor apparatus according to claim 1, wherein only the first and third data storage areas, only the second and fourth data storage areas, only the fifth and seventh data storage areas, or only the fifth and seventh data storage areas are activated in response to the first and second channel select signals and the first and second clock enable signals.

4. The semiconductor apparatus according to claim 1, wherein each of the first to eighth data storage areas is activated when both of the channel select signal and the clock enable signal inputted thereto are enabled.

5. A semiconductor apparatus comprising:
a data storage group comprising a first data storage area activated when both of a first channel select signal and a first clock enable signal are enabled, a second data storage area activated when both of a second channel select signal and a second clock enable signal are enabled, a third data storage area activated when both of the first channel select signal and the second clock enable signal are enabled, and a fourth data storage area activated when both of the second channel select signal and the first clock enable signal are enabled;
first and second channel select pads configured to transmit the first channel select signal to the first and third data storage areas, respectively;
third and fourth channel select pads configured to transmit the second channel select signal to the second and fourth data storage areas, respectively;
first and second clock enable pads configured to transmit the first clock enable signal to the first and fourth data storage areas, respectively; and
third and fourth clock enable pads configured to transmit the second clock enable signal to the second and third data storage areas, respectively.

6. The semiconductor apparatus according to claim 5, wherein the first and second channel select signals and the first and second clock enable signals are inputted from an external test device, only one of the first and second channel select signals is enabled, and only one of the first and second clock enable signals is enabled.

7. A semiconductor apparatus comprising:
a data storage group comprising first to eighth data storage areas;
a first channel select pad configured to transmit a channel select signal to the first and third data storage areas;
a first inverting unit configured to invert the channel select signal inputted from the first channel select pad and transmit the inverted channel select signal to the second and fourth data storage areas;
a first clock enable pad configured to transmit a clock enable signal to the first and third data storage areas;
a second inverting unit configured to invert the clock enable signal inputted from the first clock enable pad and transmit the inverted clock enable signal to the second and fourth data storage areas;
a second channel select pad configured to transmit the channel select signal to the sixth and eighth data storage areas;
a third inverting unit configured to invert the channel select signal inputted from the second channel select pad and transmit the inverted channel select signal to the fifth and seventh data storage areas;
a second clock enable pad configured to transmit the clock enable signal to the fifth and seventh data storage areas; and
a fourth inverting unit configured to invert the clock enable signal inputted from the second clock enable pad and transmit the inverted clock enable signal to the sixth and eighth data storage areas.

8. The semiconductor apparatus according to claim 7, wherein each of the first to eighth data storage areas is activated when both of the channel select signal and the clock enable signal are enabled.

* * * * *